United States Patent
Hsieh et al.

(10) Patent No.: US 11,683,605 B2
(45) Date of Patent: Jun. 20, 2023

(54) IMAGE SENSOR CHIP AND SENSING METHOD THEREOF

(71) Applicant: Egis Technology Inc., Hsinchu (TW)

(72) Inventors: Chih-Cheng Hsieh, Hsinchu (TW); Yen-Kai Chen, Hsinchu (TW); Tzu-Hsiang Hsu, Hsinchu (TW)

(73) Assignee: Egis Technology Inc., Hsinchu (TW)

( * ) Notice: Subject to any disclaimer, the term of this patent is extended or adjusted under 35 U.S.C. 154(b) by 97 days.

(21) Appl. No.: 17/170,831

(22) Filed: Feb. 8, 2021

(65) Prior Publication Data

US 2022/0247953 A1 Aug. 4, 2022

(30) Foreign Application Priority Data

Feb. 4, 2021 (TW) ................................ 110104198

(51) Int. Cl.
*H04N 5/232* (2006.01)
*H04N 25/75* (2023.01)
(Continued)

(52) U.S. Cl.
CPC ....... *H04N 25/75* (2023.01); *H01L 27/14643* (2013.01); *H04N 25/77* (2023.01); *H01L 27/14609* (2013.01)

(58) Field of Classification Search
None
See application file for complete search history.

(56) References Cited

U.S. PATENT DOCUMENTS

| | | | |
|---|---|---|---|
| 2010/0026838 A1 | 2/2010 | Belenky et al. | |
| 2010/0182468 A1* | 7/2010 | Posch | H04N 3/155 348/294 |

(Continued)

FOREIGN PATENT DOCUMENTS

| | | |
|---|---|---|
| CN | 103685989 | 3/2014 |
| TW | 202005360 | 1/2020 |

(Continued)

OTHER PUBLICATIONS

Title: "Inverter(logic gate)" URL: https://web.archive.org/web/20120815004030/http://en.wikipedia.org/wiki/Inverter_(logic_gate) Date: May 21, 2012 (Year: 2012).*

(Continued)

*Primary Examiner* — Twyler L Haskins
*Assistant Examiner* — Wesley J Chiu
(74) *Attorney, Agent, or Firm* — JCIPRNET

(57) ABSTRACT

An image sensor chip and a sensing method thereof are provided. The image sensor chip includes a pixel array. The pixel array includes a plurality of pixel units, and each of the pixel units includes a light sensing circuit, a reset switch and an output circuit. The reset switch is coupled to a first terminal of the light sensing circuit. The reset switch resets the light sensing circuit during reset period. The output circuit is coupled to the first terminal of the light sensing circuit. The output circuit of the pixel unit outputs difference information corresponding to the difference between the first sensing result of the light sensing circuit in a first frame period and the second sensing result of the light sensing circuit in a second frame period after the first frame period to a corresponding one of a plurality of readout lines of the pixel array.

26 Claims, 9 Drawing Sheets

(51) Int. Cl.
*H01L 27/146* (2006.01)
*H04N 25/77* (2023.01)

(56) References Cited

U.S. PATENT DOCUMENTS

| | | | |
|---|---|---|---|
| 2010/0194956 | A1 | 8/2010 | Yuan et al. |
| 2014/0078361 | A1 | 3/2014 | Bechtel et al. |
| 2014/0125994 | A1* | 5/2014 | Kim ................ G01B 11/22 356/601 |
| 2016/0227135 | A1* | 8/2016 | Matolin ................ H04N 3/155 |
| 2017/0324910 | A1 | 11/2017 | Yang et al. |
| 2018/0167575 | A1* | 6/2018 | Watanabe ............ H04N 5/3745 |
| 2019/0141265 | A1* | 5/2019 | Finateu ................ H04N 5/3745 |
| 2019/0297295 | A1 | 9/2019 | Roberts et al. |
| 2020/0084403 | A1* | 3/2020 | Suh ........................ H04N 5/379 |
| 2020/0389616 | A1* | 12/2020 | Grot .................. H04N 5/37452 |
| 2021/0185264 | A1* | 6/2021 | Wong ................... H04N 5/3745 |
| 2022/0021837 | A1* | 1/2022 | Zhu .................... H04N 5/37455 |
| 2022/0070404 | A1* | 3/2022 | Liu .................... H04N 5/37455 |

FOREIGN PATENT DOCUMENTS

| | | |
|---|---|---|
| TW | 202042544 | 11/2020 |
| WO | 2020012353 | 1/2020 |

OTHER PUBLICATIONS

"Office Action of Taiwan Counterpart Application", dated Dec. 29, 2021, p. 1-p. 7.

Tzu-Hsiang Hsu et al., "5.9 A 0.8V Multimode Vision Sensor for Motion and Saliency Detection with Ping-Pong PWM Pixel," 2020 IEEE International Solid- State Circuits Conference—(ISSCC), Feb. 16-20, 2020, pp. 110-112.

"Office Action of Taiwan Counterpart Application", dated Oct. 28, 2022, p. 1-p. 7.

* cited by examiner

IMAGE SENSOR CHIP AND SENSING METHOD THEREOF

CROSS-REFERENCE TO RELATED APPLICATION

This application claims the priority benefit of Taiwan application serial no. 110104198, filed on Feb. 4, 2021. The entirety of the above-mentioned patent application is hereby incorporated by reference herein and made a part of this specification.

BACKGROUND

Field of the Disclosure

The disclosure relates to image sensing, and particularly relates to an image sensor chip and a sensing method thereof.

Description of Related Art

The implementation of dynamic visual image sensing technology can be classified into two major methods: event-based detection type and frame-based computation type. In either case, the pixel array of the existing image sensor does not process the sensing result (data frame generated during one frame period) (such as frame difference computation). The existing image sensor outputs multiple data frames (original image frames) to the processor, and then software/firmware running on the processor performs image processing on these data frames (such as continuous frame difference computation). Generally speaking, the computational load of the processor is heavy. The continuous frame difference computation may increase the computational load of the processor and reduce the frame rate. Furthermore, in order to perform the continuous frame difference computation, the processor needs a frame buffer for storing a previous frame.

SUMMARY

The disclosure provides an image sensor chip and a sensing method thereof to provide a difference between a first sensing result in a first frame period and a second sensing result in a second frame period.

In an embodiment of the disclosure, the image sensor chip includes a pixel array. The pixel array includes multiple pixel units, and each of these pixel units includes a light sensing circuit, a first reset switch and an output circuit. The first reset switch is coupled to the first terminal of the light sensing circuit. The first reset switch is adapted to reset the light sensing circuit during a reset period. The output circuit is coupled to the first terminal of the light sensing circuit. The output circuit is configured to output difference information corresponding to the difference between the first sensing result of the light sensing circuit in a first frame period and the second sensing result of the light sensing circuit in a second frame period after the first frame period to a corresponding one of the multiple readout lines of the pixel array.

In an embodiment of the disclosure, the sensing method includes: resetting the light sensing circuit by the first reset switch during the reset period in the first frame period; generating the first sensing result by the light sensing circuit in the first frame period; resetting the light sensing circuit by the first reset switch in the reset period in the second frame period after the first frame period; generating the second sensing result by the light sensing circuit in the second frame period; outputting, by the output circuit, the difference information corresponding to the difference between the first sensing result and the second sensing result to a corresponding one of the multiple readout lines of the pixel array.

Based on the above, the image sensor chip described in the embodiments of the disclosure can perform continuous frame difference computation. The image sensor chip can store previous frames (sensing results during the first frame period). After the first frame period, the image sensor chip can generate the difference between the previous frame and the current frame (sensing results in the second frame period), and the image sensor chip can store the current frame in order to perform the continuous frame difference computation again during the next frame period.

In order to make the above-mentioned features and advantages of the disclosure more obvious and understandable, the following specific examples are given in conjunction with the accompanying drawings to describe in detail as follows.

DETAILED DESCRIPTION OF DISCLOSED EMBODIMENTS

Figure 1:
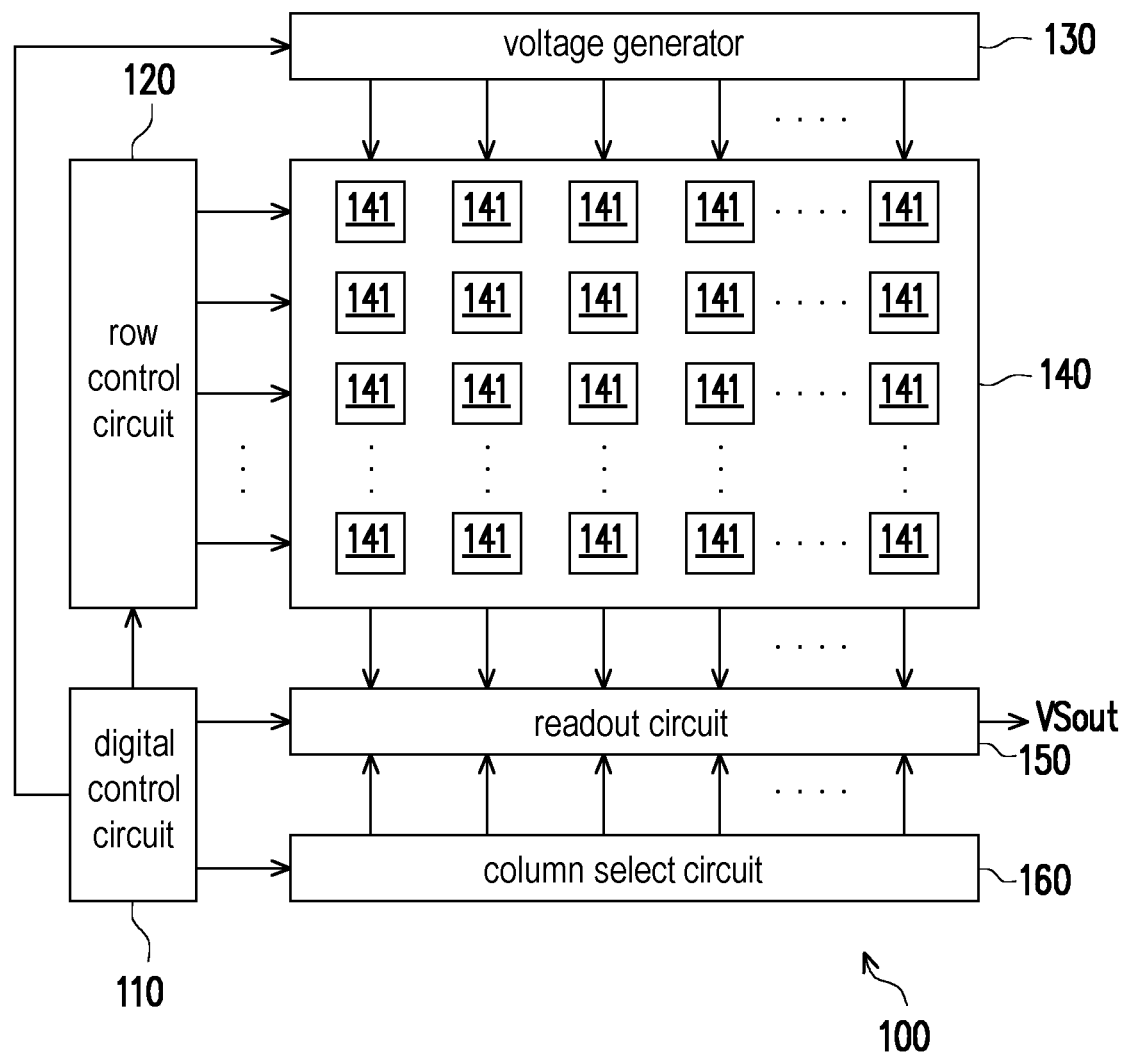
FIG. 1 is a circuit block diagram of an image sensor chip according to an embodiment of the disclosure.

The term "coupling (or connection)" used in the full text of the specification of this case (including the scope of the patent application) can refer to any direct or indirect connection means. For example, if it is described that the first device is coupled (or connected) to the second device, it should be interpreted as that the first device can be directly connected to the second device, or the first device can be indirectly connected to the second device through other devices or a connection means. The terms "first" and "second" mentioned in the full text of the description of this case (including the scope of the patent application) are adopted to name the elements, or to distinguish between different embodiments or scope, and are neither intended to limit the upper or lower limit of the number of elements nor to limit the order of elements. In addition, wherever possible, elements/components/steps denoted by the same reference numbers in the drawings and embodiments represent the same or similar parts. Elements/components/steps denoted by the same reference numerals or described in the same terms in different embodiments may serve as cross-reference for each other.

FIG. 1 is a circuit block diagram of an image sensor chip 100 according to an embodiment of the disclosure. The image sensor chip 100 shown in FIG. 1 includes a digital control circuit 110, a row control circuit 120, a voltage generator 130, a pixel array 140, a readout circuit 150, and a column select circuit 160. The readout circuit 150 is coupled to multiple readout lines of the pixel array 140. According to the operating parameters set by the system, the digital control circuit 110 can control the row control circuit 120, the voltage generator 130, the readout circuit 150, and the column select circuit 160 to output the image stream VSout. For example, based on the control of the digital control circuit 110, the image sensor chip 100 can be selectively operated in one of the image capture mode, the frame difference mode, and the saliency detection mode.

The pixel array 140 includes multiple pixel units 141. Based on the control of the digital control circuit 110, the row control circuit 120 can output control signals (such as control signals of switch) to the pixel units 141 of the pixel array 140. For example, the row control circuit 120 can reset the light sensing circuit of each pixel unit 141 of the pixel array 140 during the reset period of each frame period, and then each pixel unit 141 of the pixel array 140 can sense the image (incident light) during the exposure period of each frame period.

Based on the control of the digital control circuit 110, the voltage generator 130 can provide corresponding voltages (for example, reference voltages) to the pixel units 141 of the pixel array 140 at a preset timing, and the row control circuit 120 can output the enable voltage to scan these pixel units 141. In addition, based on the control of the digital control circuit 110, the column select circuit 160 can control the read operation of the readout circuit 150. Based on the control of the digital control circuit 110 and the column select circuit 160, the readout circuit 150 can read out the sensing result of the pixel array 140 during the readout period of each frame period to output the image stream VSout.

Depending on different design requirements, the implementation of the digital control circuit 110, the row control circuit 120, and/or the column select circuit 160 may be hardware, firmware, or software (i.e., program) or a combination of multiple of the above three. In terms of hardware, the digital control circuit 110, the row control circuit 120, and/or column select circuit 160 may be implemented in a logic circuit on an integrated circuit. The related functions of the digital control circuit 110, the row control circuit 120, and/or the column select circuit 160 can be implemented as hardware by using hardware description languages (for example, Verilog HDL or VHDL) or other suitable programming languages. For example, the related functions of the digital control circuit 110, the row control circuit 120, and/or the column select circuit 160 can be implemented in one or more controllers, microcontrollers, microprocessors, application-specific integrated circuit (ASIC), digital signal processor (DSP), field programmable gate array (FPGA) and/or various logic blocks, modules and circuits in other processing units.

In the form of software and/or firmware, the related functions of the digital control circuit 110, the row control circuit 120, and/or the column select circuit 160 can be implemented as programming codes. For example, general programming languages (such as C, C++ or assembly language) or other suitable programming languages are used to implement the digital control circuit 110, the row control circuit 120, and (or) the column select circuit 160. The programming codes can be recorded/stored in "non-transitory computer readable medium", including read only memory (ROM), hard disk drive (HDD), solid-state drive (SSD) or other storage devices. A central processing unit (CPU), a controller, a microcontroller, or a microprocessor can read from the non-transitory computer readable medium and execute the programming code, thereby realizing the related functions of the digital control circuit 110, the row control circuit 120 and (or) the column select circuit 160.

Figure 2:
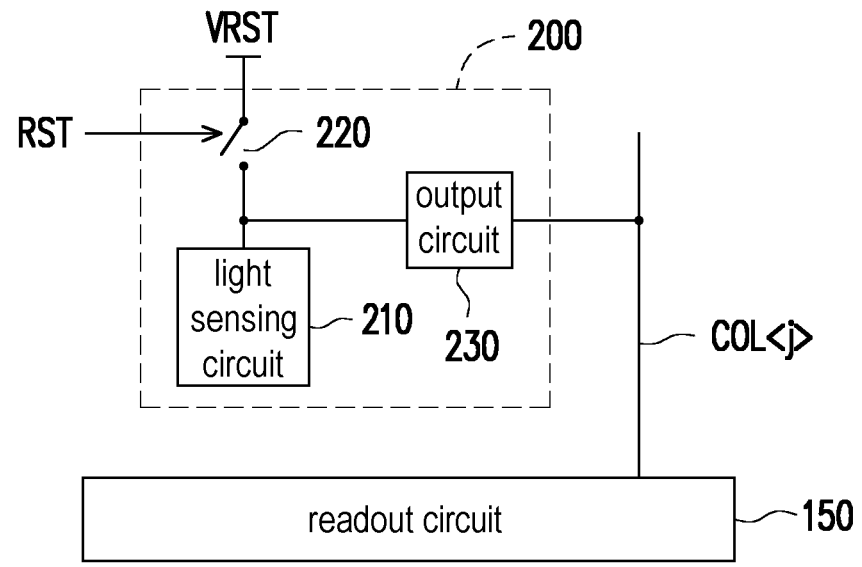
FIG. 2 is a circuit block diagram of a pixel unit according to an embodiment of the disclosure.

FIG. 2 is a circuit block diagram of a pixel unit 200 according to an embodiment of the disclosure. For the description of any one of the pixel unit 141 shown in FIG. 1, please refer to the related description of the pixel unit 200 shown in FIG. 2, and (or) the description of the pixel unit 200 shown in FIG. 2 may be derived from the related description of the pixel unit 141 shown in FIG. 1. In the embodiment shown in FIG. 2, the pixel unit 200 includes a light sensing circuit 210, a reset switch 220 and an output circuit 230.

Please refer to FIG. 1 and FIG. 2. The first terminal of the reset switch 220 is coupled to the voltage generator 130 to receive the reset voltage VRST. The level of the reset voltage VRST can be determined according to the actual design. The second terminal of the reset switch 220 is coupled to the first terminal of the light sensing circuit 210. The row control circuit 120 can output a reset signal RST to the control terminal of the reset switch 220. Each frame period includes a reset period, an exposure period, and a readout period. Based on the control of the reset signal RST, the reset switch 220 may be turned on during the reset period of each frame period to reset the light sensing circuit 210. During the exposure period and the readout period of each frame period, the reset switch 220 is turned off. After the reset period ends, the light sensing circuit 210 can continuously sense incident light during the exposure period.

Figure 3:
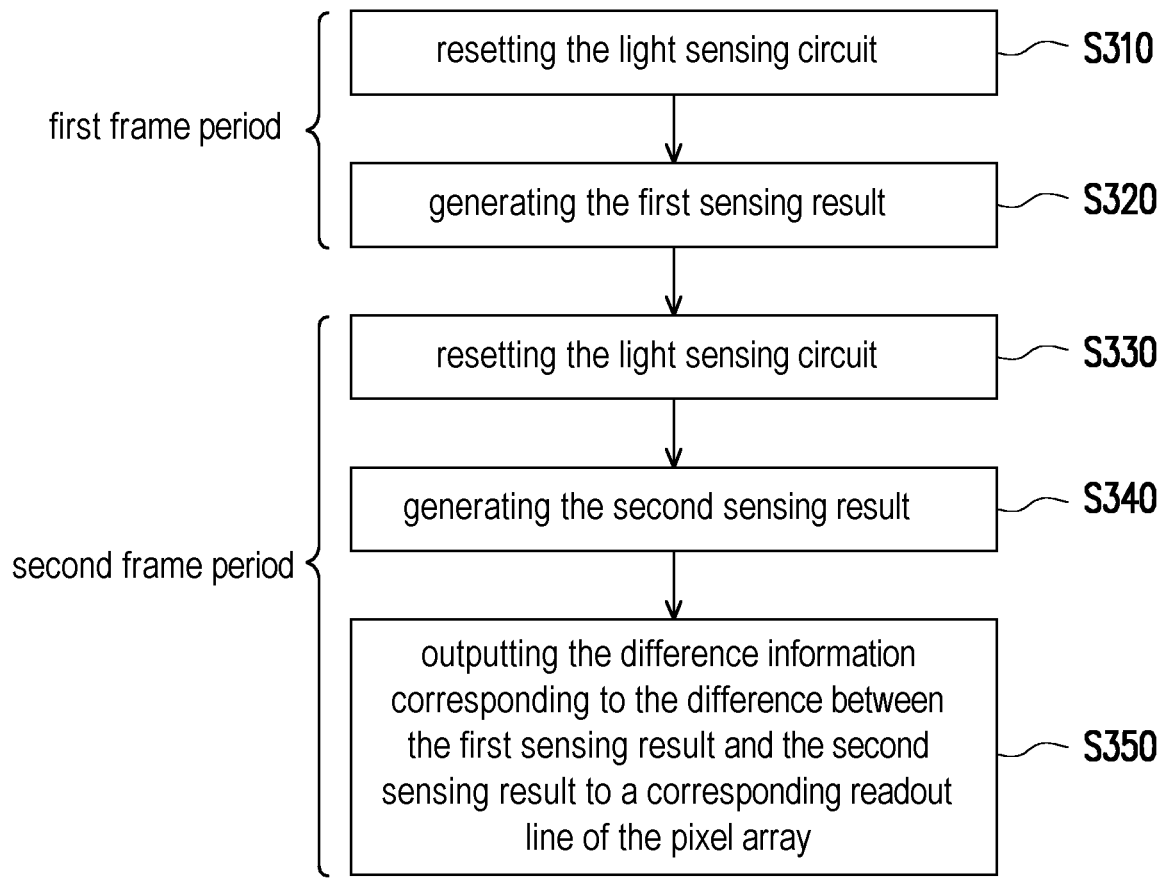
FIG. 3 is a schematic flowchart of a sensing method for an image sensor chip according to an embodiment of the disclosure.

FIG. 3 is a schematic flowchart of a sensing method for an image sensor chip according to an embodiment of the disclosure. The pixel unit 200 shown in FIG. 2 (the pixel unit 141 shown in FIG. 1) can perform the sensing method shown in FIG. 3. Please refer to FIG. 1, FIG. 2 and FIG. 3. The reset switch 220 may reset the light sensing circuit 210 in the reset period during the first frame period (step S310). The output circuit 230 is coupled to the first terminal of the light sensing circuit 210. The light sensing circuit 210 may generate a first sensing result in the first frame period (step S320). After the exposure period of the first frame period ends, the output circuit 230 can read out the sensing result (first sensing result) of the light sensing circuit 210 during the readout period of the first frame period. That is, in step S320, the output circuit 230 can read out and store the sensing result of the light sensing circuit 210 during the first frame period (for example, during the previous frame period).

During the reset period in the second frame period after the first frame period (for example, the period of the current frame), the reset switch 220 can reset the light sensing circuit 210 again (step S330). The light sensing circuit 210 can generate a second sensing result in the second frame period (step S340). The output circuit 230 can read out the new sensing result (second sensing result) of the light sensing circuit 210 in the readout period of the second frame period. In step S350, the output circuit 230 can generate corresponding difference information according to the difference between the first sensing result and the second sensing result. The output circuit 230 can output the difference information to a corresponding one of multiple readout lines COL<j> of the pixel array 140 (step 350). Therefore, the readout circuit 150 can read the difference information corresponding to the light sensing circuit 210 through the corresponding readout line COL<j> during the readout period of each frame period.

For example, based on the control of the digital control circuit 110, the output circuit 230 operates in multiple modes, such as image capture mode and frame difference mode. When the output circuit 230 operates in the frame difference mode, the reset switch 220 can reset the light sensing circuit 210 during the reset period in the first frame period, and the output circuit 230 can record (store) the first sensing result in the first frame period. The reset switch 220 can reset the light sensing circuit during the reset period in the second frame period, and the output circuit 230 can generate the difference information corresponding to the difference between the first sensing result and the second sensing result during the second frame period. For example, the output circuit 230 can compare the difference between the first sensing result and the second sensing result with a first reference voltage (for example, a ramp voltage), and the output circuit 230 can output the difference information to the corresponding readout line COL<j> in the readout period during the second frame period.

When the output circuit 230 operates in the image capture mode, the reset switch 220 can reset the light sensing circuit 210 during the reset period in the first frame period, and the output circuit 230 can compare the first sensing result of the light sensing circuit 210 with the first reference voltage (such as a ramp voltage) in the readout period during the first frame period to generate the first sensing information corresponding to the first sensing result. The output circuit 230 can output the first sensing information to the corresponding readout line COL<j>. The reset switch 220 may reset the light sensing circuit 210 during the reset period in the second frame period. In the readout period of the second frame period, the output circuit 230 can compare the second sensing result of the light sensing circuit 210 with the first reference voltage to generate the second sensing information corresponding to the second sensing result, and the output circuit 230 can output the second sensing information to the corresponding readout line COL<j>.

As described above, the output circuit 230 may perform continuous frame difference computation to output difference information corresponding to the difference between the first sensing result during the first frame period and the second sensing result during the second frame period. In addition, the output circuit 230 can store the second sensing result during the second frame period, so as to perform the continuous frame difference computation again in the third frame period after the second frame period. Therefore, the next-level circuit (not shown, such as a processor) of the image sensor chip 100 can omit the continuous frame difference computation to reduce the computation load of the processor, thereby increasing the frame rate as much as possible. Furthermore, due to the omission of continuous frame difference computation, the processor can omit the frame buffer.

Figure 4:
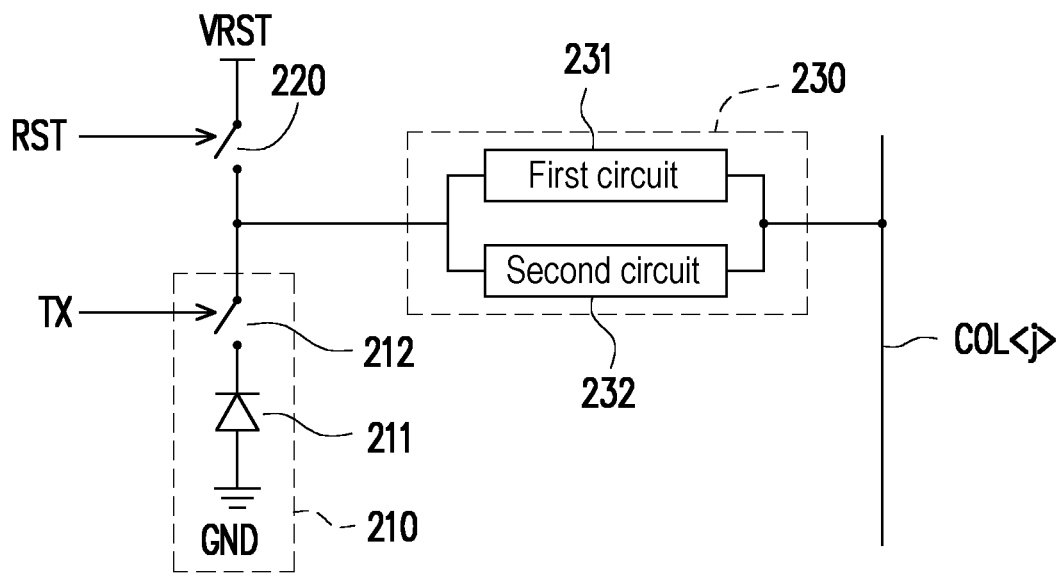
FIG. 4 is a circuit block diagram illustrating the light sensing circuit and the output circuit shown in FIG. 2 according to an embodiment of the disclosure.

FIG. 4 is a circuit block diagram illustrating the light sensing circuit 210 and the output circuit 230 shown in FIG. 2 according to an embodiment of the disclosure. In the embodiment shown in FIG. 4, the light sensing circuit 210 includes a light sensing element 211 and a switch 212. Depending on the actual design, the light sensing element 211 may include a photodiode or other light sensing elements. The row control circuit 120 can output a control signal TX to the control terminal of the switch 212. Based on the control of the control signal TX, the switch 212 is turned on during the reset period and the exposure period of each frame period. During the readout period of each frame period, the switch 212 is turned off. The first terminal of the switch 212 is coupled to the first terminal of the light sensing circuit 210, that is, coupled to the reset switch 220 and the output circuit 230. The second terminal of the switch 212 is coupled to the first terminal of the light sensing element 211 (for example, the cathode of the photodiode). The second terminal of the light sensing element 211 (for example, the anode of the photodiode) is coupled to a reference voltage (for example, the ground voltage GND).

In the embodiment shown in FIG. 4, the output circuit 230 includes a first circuit 231 and a second circuit 232. The input terminal of the first circuit 231 and the input terminal of the second circuit 232 are both coupled to the first terminal of the light sensing circuit 210. The output terminal of the first circuit 231 and the output terminal of the second circuit 232 are both coupled to the corresponding readout line COL<j>.

When the output circuit 230 operates in the frame difference mode, the output circuit 230 shown in FIG. 4 uses a ping-pong architecture to perform continuous frame difference computation. The first circuit 231 records (stores) the first sensing result of the light sensing circuit 210 during the first frame period. During the second frame period, the second circuit 232 records (stores) the second sensing result of the light sensing circuit 210, and the first circuit 231 generates the first difference information corresponding to the difference between the first sensing result and the second sensing result. Therefore, the first circuit 231 can output the first difference information to the corresponding readout line COL<j> during the readout period in the second frame period. The reset switch 220 resets the light sensing element 211 of the light sensing circuit 210 again in the reset period in the third frame period after the second frame period. In the third frame period, the first circuit 231 records (stores) the new sensing result (third sensing result) of the light sensing circuit 210 during the third frame period, the second circuit 232 generates the second difference information corresponding to the difference between the second sensing result and the third sensing result, and the second circuit 232 outputs the second difference information to the corresponding readout line COL<j> during the readout period in the third frame period.

When the output circuit 230 operates in the image capture mode, the output circuit 230 shown in FIG. 4 may not perform continuous frame difference computation, but output the original pixel data corresponding to the light sensing circuit 210 to the corresponding readout line COL<j>. When the output circuit 230 operates in the image capture mode, one of the first circuit 231 and the second circuit 232 is disabled, and the other of the first circuit 231 and the second circuit 232 outputs the first sensing information corresponding to the first sensing result and the second sensing information corresponding to the second sensing result to the corresponding readout line COL<j> in the readout period during the first frame period and the readout period during the second frame period respectively. For example, the row control circuit 120 may output enable voltages ROW1 and ROW2 to enable the first circuit 231 and disable the second circuit 232. During the readout period in the first frame period, the first circuit 231 can output the first sensing information (original pixel data) corresponding to the first sensing result of the light sensing circuit 210 to the corresponding readout line COL<j>. During the readout period in the second frame period, the first circuit 231 can output the second sensing information (original pixel data) corresponding to the second sensing result of the light sensing circuit 210 to the corresponding readout line COL<j>.

Figure 5:
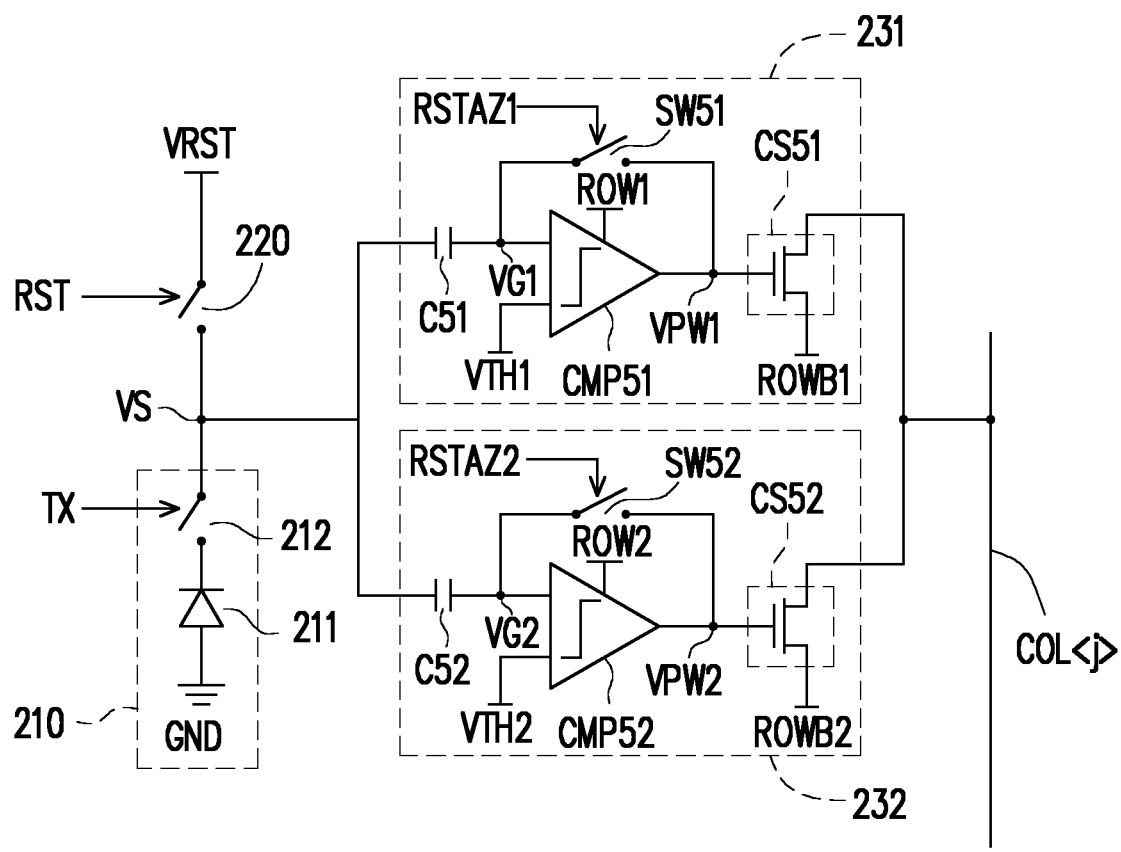
FIG. 5 is a circuit block diagram illustrating the first circuit and the second circuit of the output circuit shown in FIG. 4 according to an embodiment of the disclosure.

FIG. 5 is a circuit block diagram illustrating the first circuit 231 and the second circuit 232 of the output circuit 230 shown in FIG. 4 according to an embodiment of the disclosure. In the embodiment shown in FIG. 5, the first circuit 231 includes a capacitor C51, a comparator CMP51, a reset switch SW51 and a current source CS51, and the second circuit 232 includes a capacitor C52, a comparator CMP52, a reset switch SW52 and a current source CS52. The first terminal of the capacitor C51 and the first terminal of the capacitor C52 are coupled to the first terminal of the light sensing circuit 210. The current terminal of the current source CS51 and the current terminal of the current source CS52 are coupled to the corresponding readout line COL<j>.

Please refer to FIG. 1 and FIG. 5. The power terminal of the comparator CMP51 receives the enable voltage ROW1. The first input terminal of the comparator CMP51 is coupled to the second terminal of the capacitor C51. The second input terminal of the comparator CMP51 is coupled to the voltage generator 130 to receive the reference voltage VTH1. The control terminal of the current source CS51 is coupled to the output terminal of the comparator CMP51. The reference terminal of the current source CS51 is coupled to a reference voltage (for example, the reference voltage ROWB1). The first terminal and the second terminal of the reset switch SW51 are respectively coupled to the first input terminal of the comparator CMP51 and the output terminal of the comparator CMP51. The control terminal of the reset switch SW51 is coupled to the row control circuit 120 to receive the reset signal RSTAZ1. The row control circuit 120 can output the reset signal RSTAZ1 to selectively reset the first circuit 231. The power terminal of the comparator CMP52 receives the enable voltage ROW2. The first input terminal of the comparator CMP52 is coupled to the second terminal of the capacitor C52. The second input terminal of the comparator CMP52 is coupled to the voltage generator 130 to receive the reference voltage VTH2. The control terminal of the current source CS52 is coupled to the output terminal of the comparator CMP52. The reference terminal of the current source CS52 is coupled to a reference voltage (for example, the reference voltage ROWB2). The first terminal and the second terminal of the reset switch SW52 are respectively coupled to the first input terminal of the comparator CMP52 and the output terminal of the comparator CMP52. The control terminal of the reset switch SW52 is coupled to the row control circuit 120 to receive the reset signal RSTAZ2. The row control circuit 120 can output the reset signal RSTAZ2 to selectively reset the second circuit 232.

Figure 6:
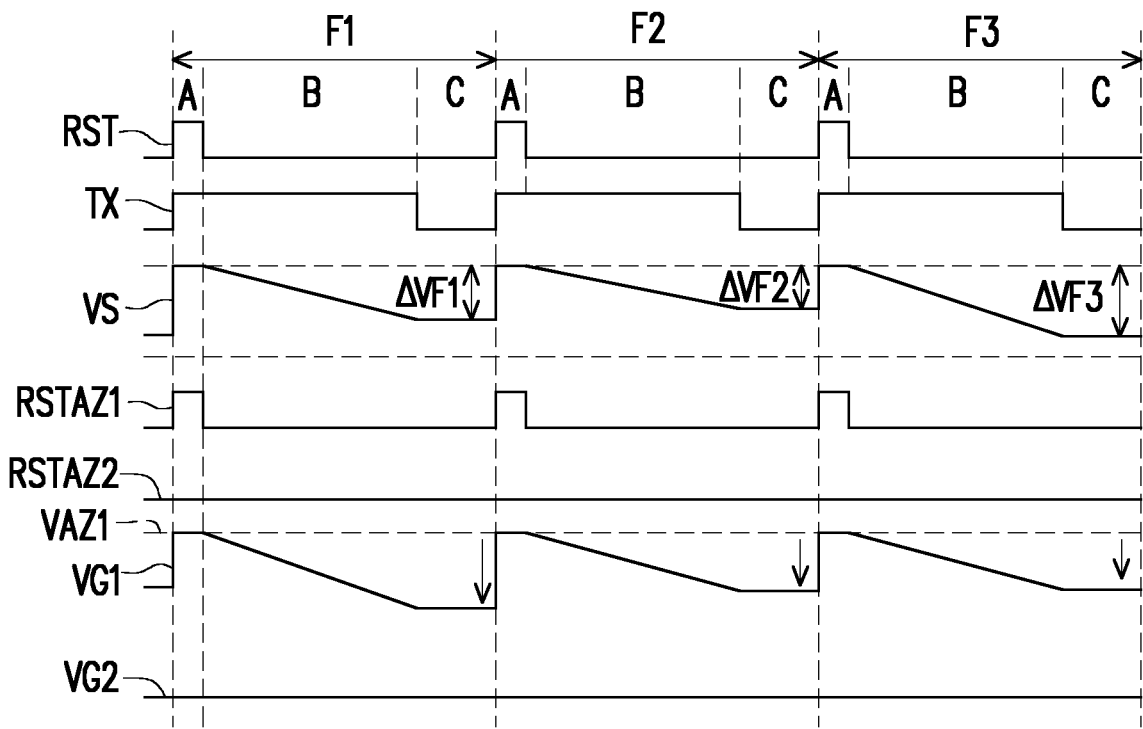
FIG. 6 is a schematic diagram illustrating a signal waveform of the output circuit shown in FIG. 5 operating in the image capture mode according to an embodiment of the disclosure.

FIG. 6 is a schematic diagram illustrating a signal waveform of the output circuit shown in FIG. 5 operating in the image capture mode according to an embodiment of the disclosure. When the output circuit 230 operates in the image capture mode, one of the first circuit 231 and the second circuit 232 is disabled, and the other of the first circuit 231 and the second circuit 232 outputs the sensing information corresponding to the sensing result of the light sensing circuit 210 to the corresponding readout line COL<j>. It is assumed in the embodiment shown in FIG. 6 that the first circuit 231 outputs the sensing information to the corresponding readout line COL<j>, and the second circuit 232 is disabled. This embodiment provides no limitation to the disabling mechanism of the second circuit 232. For example, by setting the reference voltage ROWB2 to a high level, the second circuit 232 can be disabled. Or (and) by stopping the power supply to the comparator CMP52, that is, by pulling down the enable voltage ROW2, the second circuit 232 can be disabled. In the embodiment shown in FIG. 6, the reset signal RSTAZ2 continuously turns on the reset switch SW52, so that the input voltage VG2 of the comparator CMP52 is maintained at the reset level.

Figure 7:
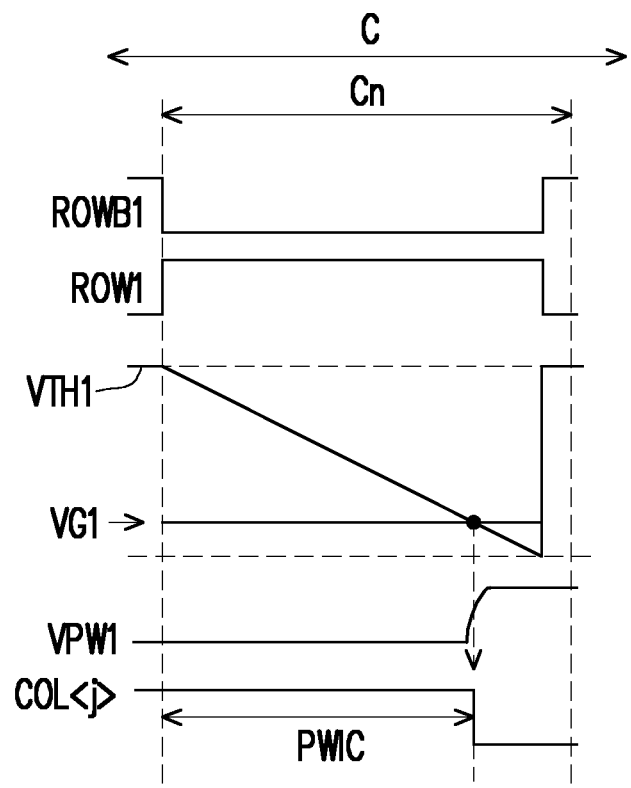
FIG. 7 is a schematic diagram illustrating a signal waveform of a corresponding sub-period in the readout period shown in FIG. 6 according to an embodiment of the disclosure.

The schematic waveform diagram shown in FIG. 6 illustrates a frame period F1, a frame period F2, and a frame period F3. In the embodiment shown in FIG. 6, each frame period includes a reset period A, an exposure period B, and a readout period C. The readout period C is divided into multiple sub-periods, and each sub-period is the scan time of a row of pixel units of the pixel array 140. For example, FIG. 7 is a schematic diagram illustrating a signal waveform of a corresponding sub-period Cn in the readout period C shown in FIG. 6 according to an embodiment of the disclosure.

Please refer to FIG. 5 and FIG. 6. In the reset period A of the frame period F1, the reset signal RST turns on the reset switch 220, the control signal TX turns on the switch 212, the reset signal RSTAZ1 turns on the reset switch SW51, and the comparator CMP51 is in the disabled state (for example, pulled down the enable voltage ROW1). Therefore, the sensing result VS of the light sensing circuit 210 is pulled up to the reset voltage VRST, and the input voltage VG1 of the comparator CMP51 is also reset to the reset level VAZ1. The reset level VAZ1 can be determined depending on actual design.

In the exposure period B of the frame period F1, the reset signal RST turns off the reset switch 220, the control signal TX turns on the switch 212, the reset signal RSTAZ1 turns off the reset switch SW51, and the comparator CMP51 is in the disabled state (e.g. pull down the enable voltage ROW1). When the incident light irradiates the light sensing element 211, the sensing result VS of the light sensing circuit 210 will gradually decrease. After the exposure period B of the frame period F1 ends, the sensing result VS decreases by ΔVF1. By analogy, the sensing result VS decreases by ΔVF2 during the frame period F2, and the sensing result VS decreases by ΔVF3 during the frame period F3.

The stronger the light quantity (light intensity) of the incident light, the faster the reduction speed of the level of the sensing result VS. That is, the decrease magnitude ΔVF1 is associated with the light quantity (light intensity) of the incident light irradiating the light sensing element 211. The decrease magnitude ΔVF1 of the sensing result VS will be coupled to the input voltage VG1. In response to the decrease of the sensing result VS, the input voltage VG1 of the comparator CMP51 also gradually decreases. For example, the decrease magnitude of the input voltage VG1 may be proportional to the decrease magnitude of the sensing result VS.

In the readout period C of the frame period F1, the reset signal RST turns off the reset switch 220, the control signal TX turns off the switch 212, and the reset signal RSTAZ1 turns off the reset switch SW51. Please refer to FIG. 5, FIG. 6 and FIG. 7. In the corresponding sub-period Cn of the readout period C of the frame period F1, by setting the enable voltage ROW1 to a high level, the comparator CMP51 is in an enabled state. By setting the reference voltage ROWB1 to a low level, the first circuit 231 can be enabled in the corresponding sub-period Cn.

When the output circuit 230 operates in the image capture mode, the reference voltage VTH1 is a ramp voltage in the corresponding sub-period Cn, as shown in FIG. 7. The comparator CMP51 can compare the input voltage VG1 with the reference voltage VTH1 in the corresponding sub-period Cn. When the input voltage VG1 is lower than the reference voltage VTH1, the output voltage VPW1 of the comparator CMP51 is at a low level. Based on the low-level output voltage VPW1, the current source CS51 can draw less current (or draw no current) from the corresponding readout line COL<j>, so that the voltage of the corresponding readout line COL<j> can be maintained at a high level. When the input voltage VG1 is higher than the reference voltage VTH1, the output voltage VPW1 of the comparator CMP51 is at a high level. Based on the high-level output voltage VPW1, the current source CS51 can draw current (or draw more current) from the corresponding readout line COL<j>, so that the voltage of the corresponding readout line COL<j> can be pulled down.

When the output circuit 230 operates in the image capture mode, the readout circuit 150 can count the time length of the voltage (first sensing information) of the corresponding readout line COL<j> in a corresponding sub-period Cn to obtain the first counting code corresponding to the first sensing result, and the readout circuit 150 can count the second time length of the voltage (second sensing information) of the corresponding readout line COL<j> in another corresponding sub-period Cn to obtain the second counting code corresponding to the second sensing result. For example, the period during which the voltage of the corresponding readout line COL<j> maintains at a high level in the corresponding sub-period Cn is the comparison result PWIC in FIG. 7.

The readout circuit 150 can count the time length of the comparison result PWIC described in FIG. 7 in the corresponding sub-period Cn to generate a counting result (counting code), and use the counting result as the sensing result of the light sensing circuit 210 in the frame period F1. In some embodiments, the readout circuit 150 can count the number of pulses (counting result) of a clock signal (not shown) in the comparison result PWIC, and use this number of pulses as the time length of the comparison result PWIC. By analogy, the readout circuit 150 can obtain the sensing results of the light sensing circuit 210 during the frame period F2 and the frame period F3.

Figure 8:
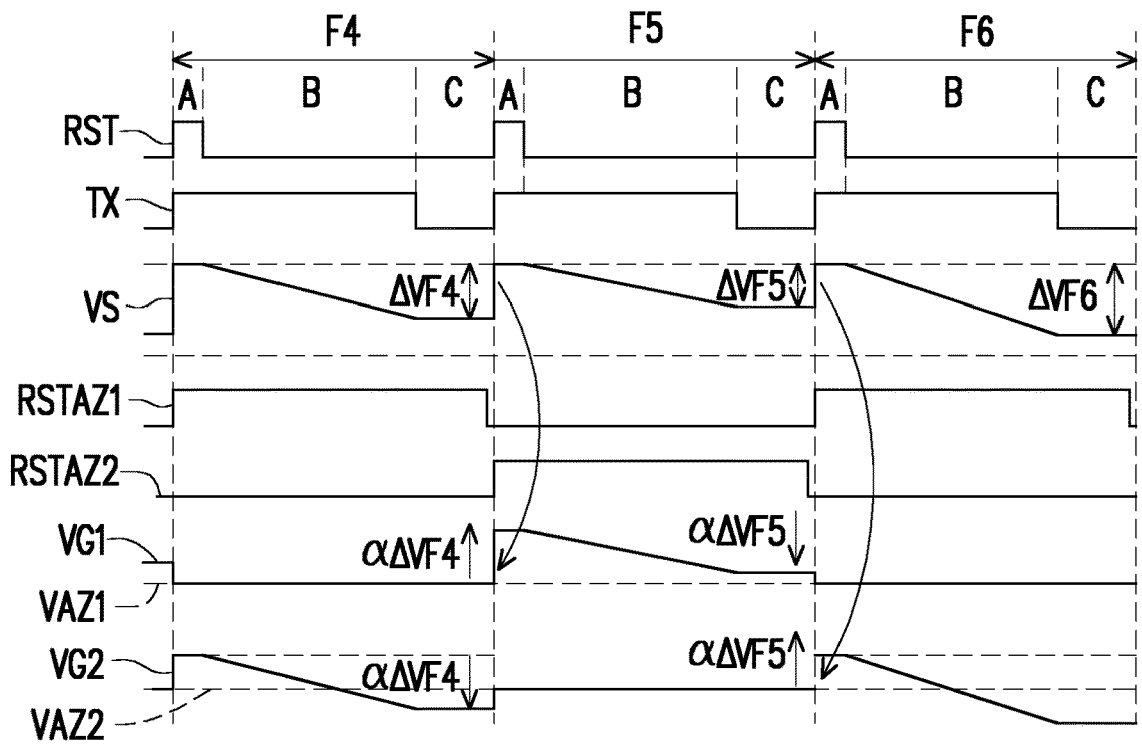
FIG. 8 is a schematic diagram illustrating a signal waveform of the output circuit shown in FIG. 5 operating in the frame difference mode according to another embodiment of the disclosure.

FIG. 8 is a schematic diagram illustrating a signal waveform of the output circuit shown in FIG. 5 operating in the frame difference mode according to another embodiment of the disclosure. The waveform diagram shown in FIG. 8 illustrates the frame period F4, the frame period F5, and the frame period F6. In the embodiment shown in FIG. 8, each frame period includes a reset period A, an exposure period B, and a readout period C. The readout period C is divided into multiple sub-periods, and each sub-period is the scan time of a row of pixel units of the pixel array 140. For example, FIG. 9 is a schematic diagram illustrating a signal waveform of a corresponding sub-period Cn in the readout period C shown in FIG. 8 according to an embodiment of the disclosure.

Figure 9:
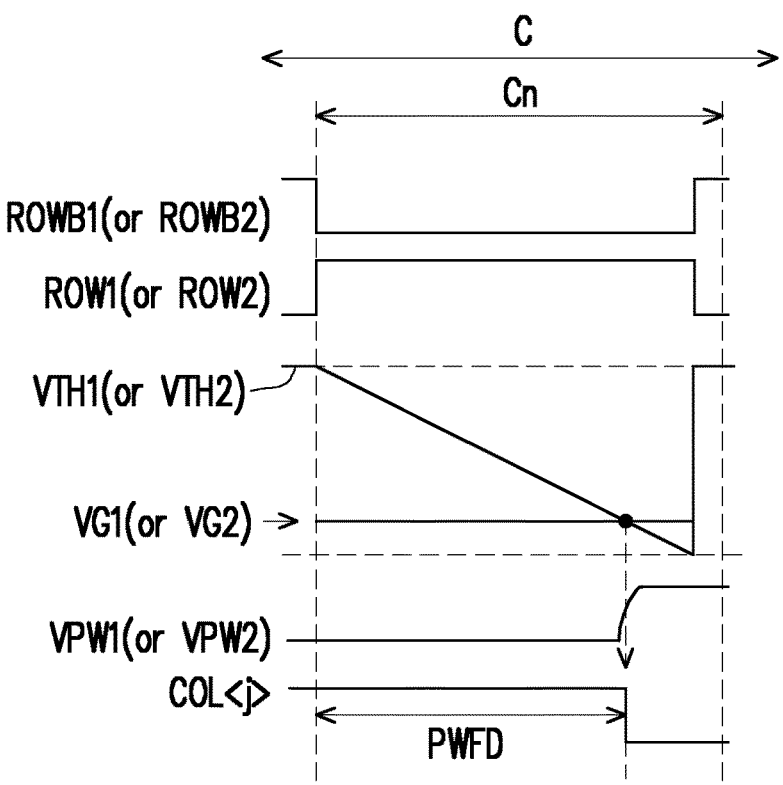
FIG. 9 is a schematic diagram illustrating a signal waveform of a corresponding sub-period in the readout period shown in FIG. 8 according to an embodiment of the disclosure.

When the output circuit 230 operates in the frame difference mode, the description concerning the operation of the pixel unit 200 and the readout circuit 150 can be derived from the related descriptions of FIG. 8 and FIG. 9. Please refer to FIG. 5, FIG. 8 and FIG. 9. In the reset period A of the frame period F4, the reset signal RST turns on the reset switch 220, the control signal TX turns on the switch 212, the reset signal RSTAZ1 turns on the reset switch SW51, the reset signal RSTAZ2 turns off the reset switch SW52, and the comparator CMP51 and the comparator CMP52 are in a disabled state (for example, pull down the enable voltages ROW1 and ROW2). Therefore, the sensing result VS of the light sensing circuit 210 is pulled up to the reset voltage VRST, and the input voltage VG1 of the comparator CMP51 is also reset to the reset level VAZ1.

In the exposure period B of the frame period F4 and the readout period C of the frame period F4, the reset signal RST turns off the reset switch 220, the control signal TX turns on the switch 212, the reset signal RSTAZ1 turns on the reset switch SW51, the reset signal RSTAZ2 turns off the reset switch SW52, and the comparator CMP1 and the comparator CMP52 are in a disabled state (for example, pull down the enable voltages ROW1 and ROW2). When the incident light irradiates the light sensing element 211, the sensing result VS of the light sensing circuit 210 will gradually decrease. After the exposure period B of the frame period F4 ends, the sensing result VS decreases by $\Delta VF4$. By analogy, the decrease magnitude of the sensing result VS during the frame period F5 is $\Delta VF5$, and the decrease magnitude of the sensing result VS during the frame period F6 is $\Delta VF6$. The decrease magnitude $\Delta VF4$, $\Delta VF5$, and $\Delta VF6$ are associated with the light quantity (light intensity) of the incident light that irradiates the light sensing element 211. The decrease magnitude $\Delta VF4$, $\Delta VF5$, and $\Delta VF6$ of the sensing result VS are coupled to the input voltages VG1 and VG2.

Please refer to FIG. 5, FIG. 8 and FIG. 9. In the corresponding sub-period Cn of the readout period C of the frame period F4, the output of the first circuit 231 is in the disabled state (for example, pull up the reference voltage ROWB1), the comparator CMP51 is in the disabled state (for example, pull down the enable voltage ROW1), the output of the second circuit 232 is in the enabled state (for example, pull down the reference voltage ROWB2), and the comparator CMP52 is in the enabled state (for example, pull up the enable voltage ROW2). Under the circumstances (the exposure period B and the readout period C of the frame period F4), the sensing result of the light sensing circuit 210 during the frame period F4 can be recorded (stored) in the capacitor C51.

In the reset period A of the frame period F5, the reset signal RST turns on the reset switch 220, the control signal TX turns on the switch 212, the reset signal RSTAZ1 turns off the reset switch SW51, the reset signal RSTAZ2 turns on the reset switch SW52, and the comparator CMP51 and the comparator CMP52 are in the disabled state (for example, pull down the enable voltages ROW1 and ROW2). Therefore, the sensing result VS of the light sensing circuit 210 is pulled up to the reset voltage VRST, and the input voltage VG2 of the comparator CMP52 is also reset to the reset level VAZ2. The reset level VAZ2 can be determined depending on the actual design. When the sensing result VS is pulled up to the reset voltage VRST, the decrease magnitude ΔVF4 of the sensing result VS will be coupled to the input voltage VG1 (that is, the increase magnitude of the input voltage VG1 is associated with the decrease magnitude ΔVF4).

In the exposure period B of the frame period F5 and the readout period C of the frame period F5, the reset signal RST turns off the reset switch 220, the control signal TX turns on the switch 212, the reset signal RSTAZ1 turns off the reset switch SW51, the reset signal RSTAZ2 turns on the reset switch SW52, and the comparator CMP51 and the comparator CMP52 are in the disabled state (for example, pull down the enable voltages ROW1 and ROW2). When the incident light irradiates the light sensing element 211, the sensing result VS of the light sensing circuit 210 will gradually decrease. The decrease magnitude ΔVF5 of the sensing result VS will be coupled to the input voltage VG1 (that is, the decrease magnitude of the input voltage VG1 is associated with the decrease magnitude ΔVF5). Under the circumstances (the readout period C of the frame period F5), the "difference between the input voltage VG1 and the reset level VAZ1" is associated with the "difference between the decrease magnitude ΔVF4 and the decrease magnitude ΔVF5". That is, the level of the input voltage VG1 in the readout period C of the frame period F5 is associated with the "difference between the sensing result of the light sensing element 211 in the frame period F4 and the sensing result of the light sensing element 211 in the frame period F5." Under the circumstances (the exposure period B and the readout period C of the frame period F5), the sensing result of the light sensing circuit 210 during the frame period F5 can be recorded (stored) in the capacitor C52.

Please refer to FIG. 5, FIG. 8 and FIG. 9. In the corresponding sub-period Cn of the readout period C of the frame period F5, the comparator CMP51 is in the enabled state (for example, pull up the enable voltage ROW1), and the comparator CMP52 is in the disabled state (for example, pull down the enable voltage ROW2). By setting the reference voltage ROWB1 to a low level, the output of the first circuit 231 can be enabled in the corresponding sub-period Cn of the frame period F5. By setting the reference voltage ROWB2 to a high level, the output of the second circuit 232 can be disabled in the corresponding sub-period Cn of the frame period F5.

When the output circuit 230 operates in the frame difference mode, the reference voltage VTH1 (or VTH2) is a ramp voltage in the corresponding sub-period Cn, as shown in FIG. 9. Under the circumstances (the corresponding sub-period Cn of the frame period F5), the comparator CMP51 can compare the input voltage VG1 with the reference voltage VTH1. When the input voltage VG1 is lower than the reference voltage VTH1, the output voltage VPW1 of the comparator CMP51 is at a low level. Based on the low-level output voltage VPW1, the current source CS51 can draw less current (or draw no current) from the corresponding readout line COL<j>, so that the voltage of the corresponding readout line COL<j> can be maintained at a high level. When the input voltage VG1 is higher than the reference voltage VTH1, the output voltage VPW1 of the comparator CMP51 is at a high level. Based on the high-level output voltage VPW1, the current source CS51 can draw current (or draw more current) from the corresponding readout line COL<j>, so that the voltage of the corresponding readout line COL<j> can be pulled down.

The readout circuit 150 can count the time length of the difference information to obtain a counting code corresponding to the difference information. For example, the period during which the voltage of the corresponding readout line COL<j> maintains at a high level in the corresponding sub-period Cn is the comparison result PWFD in FIG. 9. The readout circuit 150 can count the time length of the comparison result PWFD described in FIG. 9 in the corresponding sub-period Cn to generate a counting result (counting code). In some embodiments, the readout circuit 150 can count the number of pulses (counting result) of the clock signal (not shown) in the comparison result PWFD, and use this number of pulses as the time length of the comparison result PWFD. The counting result may represent "the difference between the sensing result of the light sensing element 211 in the frame period F4 and the sensing result of the light sensing element 211 in the frame period F5".

Based on the above, the first circuit 231 can record (store) the first sensing result of the light sensing circuit 210 during the frame period F4. In the frame period F5, the first circuit 231 can output the difference information corresponding to the difference between the first sensing result of the light sensing circuit 210 in the frame period F4 and the second sensing result of the light sensing circuit 210 in the frame period F5 to the corresponding readout line COL<j>, and the second circuit 232 can record (store) the second sensing result of the light sensing circuit 210. By analogy, in the frame period F6, the second circuit 232 can output the difference information corresponding to the difference between the second sensing result of the light sensing circuit 210 in the frame period F5 and the third sensing result of the light sensing circuit 210 in the frame period F6 to the corresponding readout line COL<j>, and the first circuit 231 can record (store) the third sensing result of the light sensing circuit 210. Therefore, when the output circuit 230 operates in the frame difference mode, the first circuit 231 and the second circuit 232 perform continuous frame difference computation in a ping-pong architecture, so that the pixel unit 200 (that is, each pixel unit 141 of the pixel array 140) can output the difference between the sensing results during different frame periods.

Figure 10A:
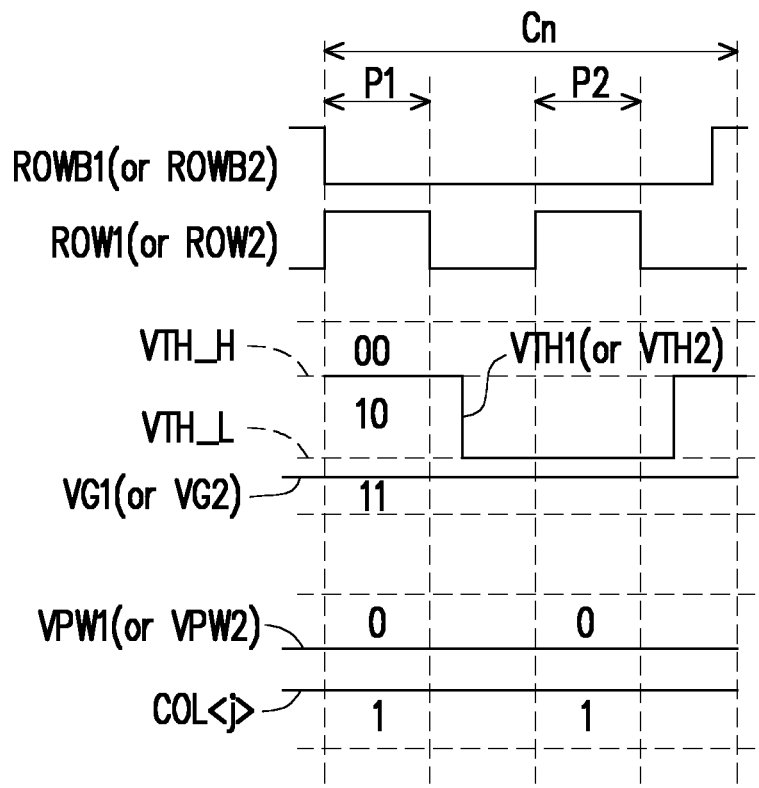
FIG. 10A, FIG. 10B, and FIG. 10C are schematic diagrams illustrating the signal waveforms of a corresponding sub-period in the readout period shown in FIG. 8 according to another embodiment of the disclosure.
Figure 10B:
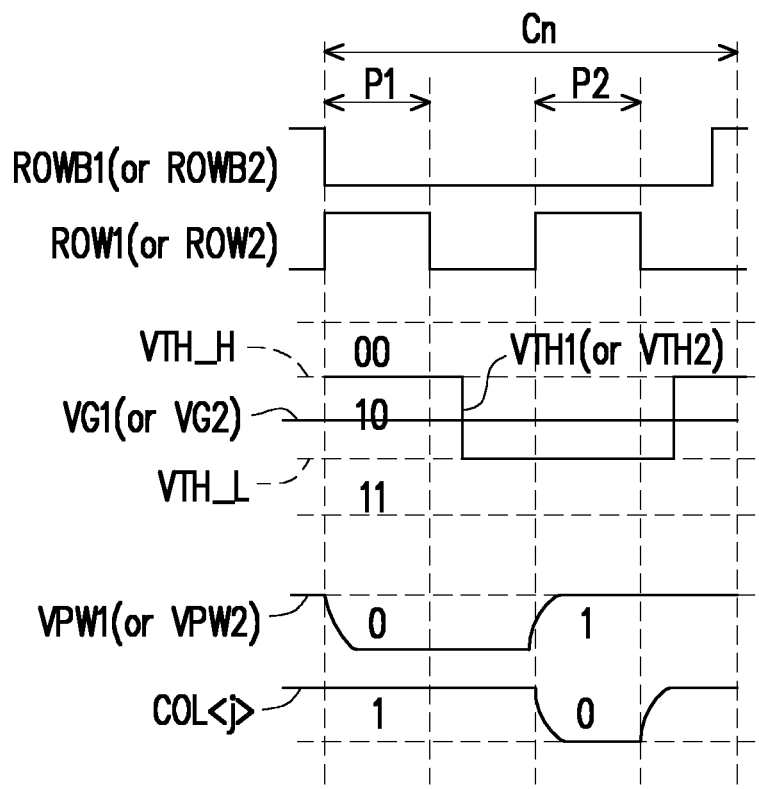
Figure 10C:
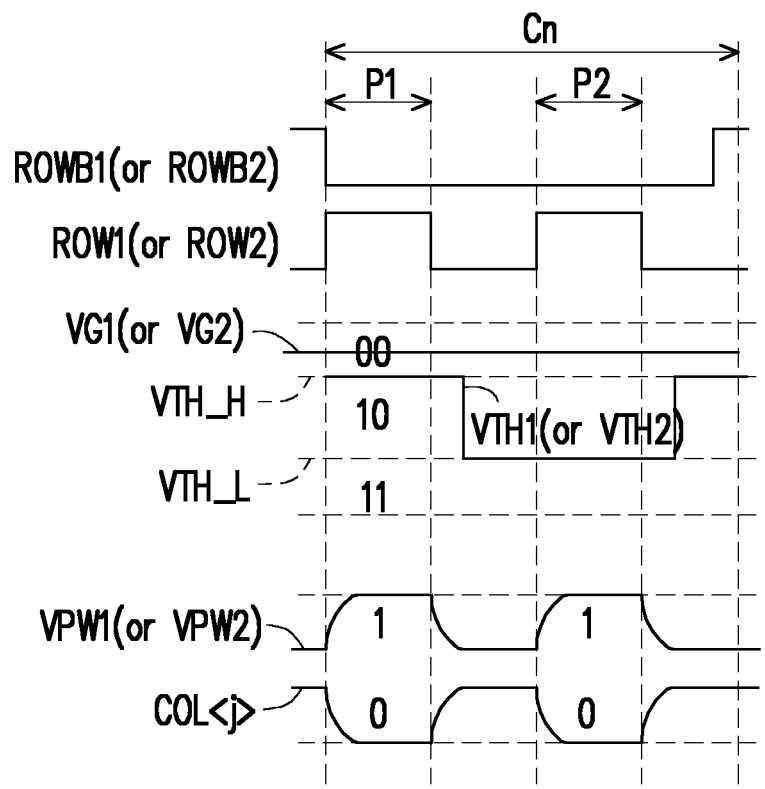

FIG. 10A, FIG. 10B, and FIG. 10C are schematic diagrams illustrating the signal waveforms of a corresponding sub-period Cn in the readout period C shown in FIG. 8 according to another embodiment of the disclosure. The description of FIG. 9 can be analogously applied to the embodiments shown in FIG. 10A, FIG. 10B and FIG. 10C. In the embodiments shown in FIG. 10A, FIG. 10B, and FIG. 10C, when the output circuit 230 operates in the frame difference mode, the reference voltage VTH1 (or VTH2) includes the voltage level VTH_H and the voltage level VTH_L. In the comparison period P1 of the corresponding sub-period Cn, the reference voltage VTH1 (or VTH2) is the voltage level VTH_H, and the output circuit 230 can compare the difference between the sensing result of the previous frame period and the sensing result of the current frame period with the voltage level VTH_H, so as to output the first difference information of the difference information to the corresponding readout line COL<j>. In the comparison period P2 of the corresponding sub-period Cn, the reference voltage VTH1 (or VTH2) is the voltage level VTH_L, and the output circuit 230 can compare the difference between the sensing result of the previous frame period and the sensing result of the current frame period with the voltage level VTH_L, so as to output the second difference information of the difference information to the corresponding readout line COL<j>. The readout circuit 150 can use the first difference information and the second difference information as frame difference codes corresponding to the difference information.

For example, in the comparison period P1 of the corresponding sub-period Cn, the output circuit 230 can compare the input voltage VG1 (or VG2) with the voltage level VTH_H of the reference voltage VTH1 (or VTH2) to output the first difference information to the corresponding readout line COL<j>. In the comparison period P2 of the corresponding sub-period Cn, the output circuit 230 can compare the input voltage VG1 (or VG2) with the voltage level VTH_L of the reference voltage VTH1 (or VTH2) to output the second difference information to the corresponding readout line COL<j>. The readout circuit 150 can use the first difference information and the second difference information as frame difference codes corresponding to the difference information. FIG. 10A, FIG. 10B and FIG. 10C illustrate different operation scenarios.

In the operation scenario shown in FIG. 10A, the input voltage VG1 (or VG2) is lower than the voltage level VTH_H and the voltage level VTH_L. The comparison result of the output circuit 230 in the comparison period P1 and the comparison result of the output circuit 230 in the comparison period P2 are both logic "0", that is, the output voltage VPW1 (or VPW2) is at a low level. Therefore, the output circuit 230 outputs logic "1" (the first difference information and the second difference information) to the corresponding readout line COL<j> in both the comparison period P1 and the comparison period P2. Both the first difference information and the second difference information are logic "1", which means that the decrease magnitude ΔVF4 of the sensing result VS is less than the decrease magnitude ΔVF5 of the sensing result VS, that is, the pixel unit 200 senses that the incident light changes from dark to bright.

In the operation scenario shown in FIG. 10B, the input voltage VG1 (or VG2) is lower than the voltage level VTH_H and higher than the voltage level VTH_L. The comparison result of the output circuit 230 in the comparison period P1 is logic "0", that is, the output voltage VPW1 (or VPW2) is at a low level in the comparison period P1. The comparison result of the output circuit 230 in the comparison period P2 is logic "1", that is, the output voltage VPW1 (or VPW2) is at a high level in the comparison period P2. Therefore, the output circuit 230 outputs logic "1" (first difference information) to the corresponding readout line COL<j> during the comparison period P1, and outputs logic "0" (second difference information) to the corresponding readout line COL<j> during the comparison period P2. The first difference information is logic "1" and the second difference information is logic "0", which means that the decrease magnitude ΔVF4 of the sensing result VS is approximately the same as the decrease magnitude ΔVF5 of the sensing result VS, that is, the pixel unit 200 senses that there is no obvious change in the incident light.

In the operation scenario shown in FIG. 10C, the input voltage VG1 (or VG2) is higher than the voltage level VTH_H and the voltage level VTH_L. The comparison result of the output circuit 230 in the comparison period P1 and the comparison result of the output circuit 230 in the comparison period P2 are both logic "1", that is, the output voltage VPW1 (or VPW2) is at a high level. Therefore, the output circuit 230 outputs logic "0" (the first difference information and the second difference information) to the corresponding readout line COL<j> during the comparison period P1 and the comparison period P2. Both the first difference information and the second difference information are logic "0", which means that the decrease magnitude ΔVF4 of the sensing result VS is greater than the decrease magnitude ΔVF5 of the sensing result VS, that is, the pixel unit 200 senses that the incident light changes from bright to dark.

Figure 11:
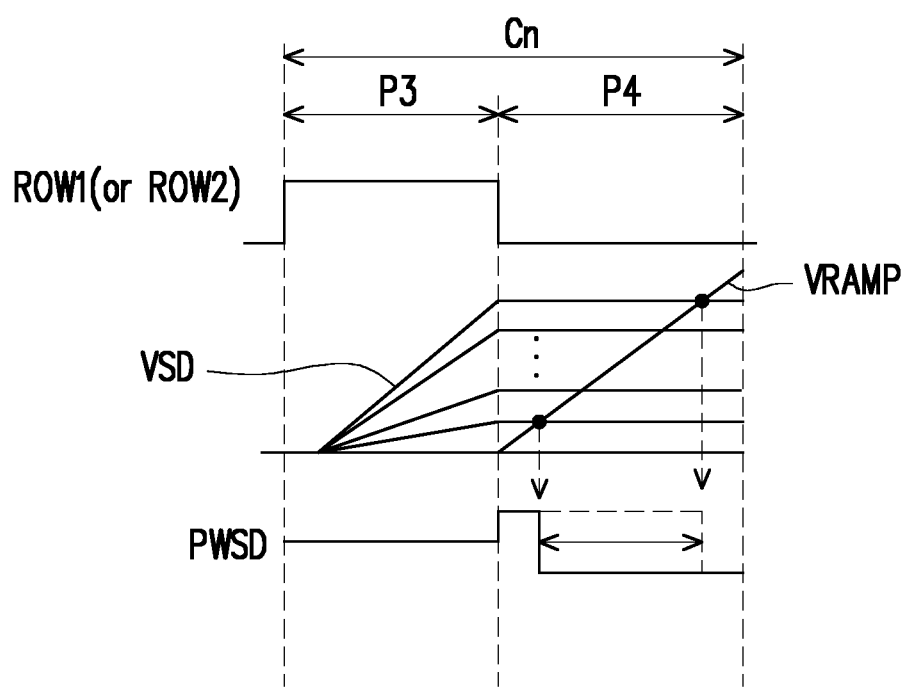
FIG. 11 is a schematic diagram illustrating a signal waveform of a corresponding sub-period in the readout period shown in FIG. 8 according to another embodiment of the disclosure.

FIG. 11 is a schematic diagram illustrating a signal waveform of a corresponding sub-period Cn in the readout period C shown in FIG. 8 according to another embodiment of the disclosure. The description of FIG. 9 can be analogously applied to the embodiment shown in FIG. 11. In the embodiment shown in FIG. 11, the corresponding readout line COL<j> is connected to multiple target pixel units, and the output of these target pixel units on the corresponding readout line COL<j> will be simultaneously enabled during the same corresponding sub-period Cn. Each of these target pixel units can be deduced by referring to the relevant description of the pixel unit 200, so no further description is incorporated herein. When the output circuit 230 operates in the frame difference mode, the reference voltage VTH1 (or VTH2) includes the first voltage level. Depending on actual design, the first voltage level may be one of the voltage level VTH_H and the voltage level VTH_L shown in FIG. 10A, FIG. 10B, and FIG. 10C. The output circuit 230 of each of the target pixel units compares the difference between the first sensing result during the previous frame period and the second sensing result during the current frame period with the first voltage level, so as to output the difference information (current signal) to the corresponding readout line COL<j>.

In the sub-period P3 of the corresponding sub-period Cn, the enable voltage ROW1 (or ROW2) of these target pixel units is pulled up to enable the output of these target pixel units, so that these target pixel units can output difference information (current signal) to the corresponding readout line COL<j>. The readout circuit 150 can integrate the difference information (current signal) of the target pixel units in the sub-period P3 to generate the integration result VSD. FIG. 11 shows the multiple possibilities of the integration result VSD. In the sub-period P4 of the corresponding sub-period Cn, the enable voltage ROW1 (or ROW2) of these target pixel units is pulled down to disable the output of these target pixel units. The readout circuit 150 can compare the integration result VSD with the ramp voltage VRAMP in the sub-period P4 to generate the comparison result PWSD. The readout circuit 150 can count the time length of the comparison result PWSD to obtain a counting code corresponding to the integration result VSD. In some embodiments, the readout circuit 150 can count the number of pulses of the clock signal (not shown) in the pulse width of the comparison result PWSD, and use this number of pulses as the time length of the comparison result PWSD.

For example, the reference voltage VTH1 (or VTH2) includes the voltage level VTH_H shown in FIG. 10A, FIG. 10B, and FIG. 10C. The output circuit 230 of any one of these target pixel units (for example, the pixel unit 200) compares the difference (input voltage VG1 or VG2) between the first sensing result during the previous frame period and the second sensing result during the current frame period with the voltage level VTH_H, so as to output the difference information (current signal) to the corresponding readout line COL<j>. When the pixel unit 200 determines that the input voltage VG1 (or VG2) is higher than the voltage level VTH_H, it means that the pixel unit 200 senses that the incident light changes from bright to dark. Under the circumstances, the pixel unit 200 can draw current (or draw more current) from the corresponding readout line COL<j> (refer to the relevant description of FIG. 10C for details). Among these target pixel units, the greater the number of pixel units which "determine the incident light changes from bright to dark", the larger the integration result VSD.

In another example, the reference voltage VTH1 (or VTH2) includes the voltage level VTH_L shown in FIG. 10A, FIG. 10B, and FIG. 10C. The output circuit 230 of any one of these target pixel units (for example, the pixel unit 200) compares the difference (input voltage VG1 or VG2) between the first sensing result during the previous frame period and the second sensing result during the current frame period with the voltage level VTH_L, so as to output the difference information (current signal) to the corresponding readout line COL<j>. When the pixel unit 200 determines that the input voltage VG1 (or VG2) is lower than the voltage level VTH_L, it means that the pixel unit 200 senses that the incident light changes from dark to bright. Under the circumstances, the pixel unit 200 draws less current (or draw no current) from the corresponding readout line COL<j> (refer to the relevant description of FIG. 10A for details). Among these target pixel units, the greater the number of pixel units that "determine the incident light changes from dark to bright", the smaller the integration result VSD.

In summary, the image sensor chip 100 can be selectively operated in the saliency detection mode in the embodiment shown in FIG. 11. In the case where the reference voltage VTH1 (or VTH2) is the voltage level VTH_H, the image sensor chip 100 is suitable for the pixel unit which detects "change from bright to dark". When the reference voltage VTH1 (or VTH2) is the voltage level VTH_L, the image sensor chip 100 is suitable for the pixel unit which detects "change from dark to bright".

Figure 12:
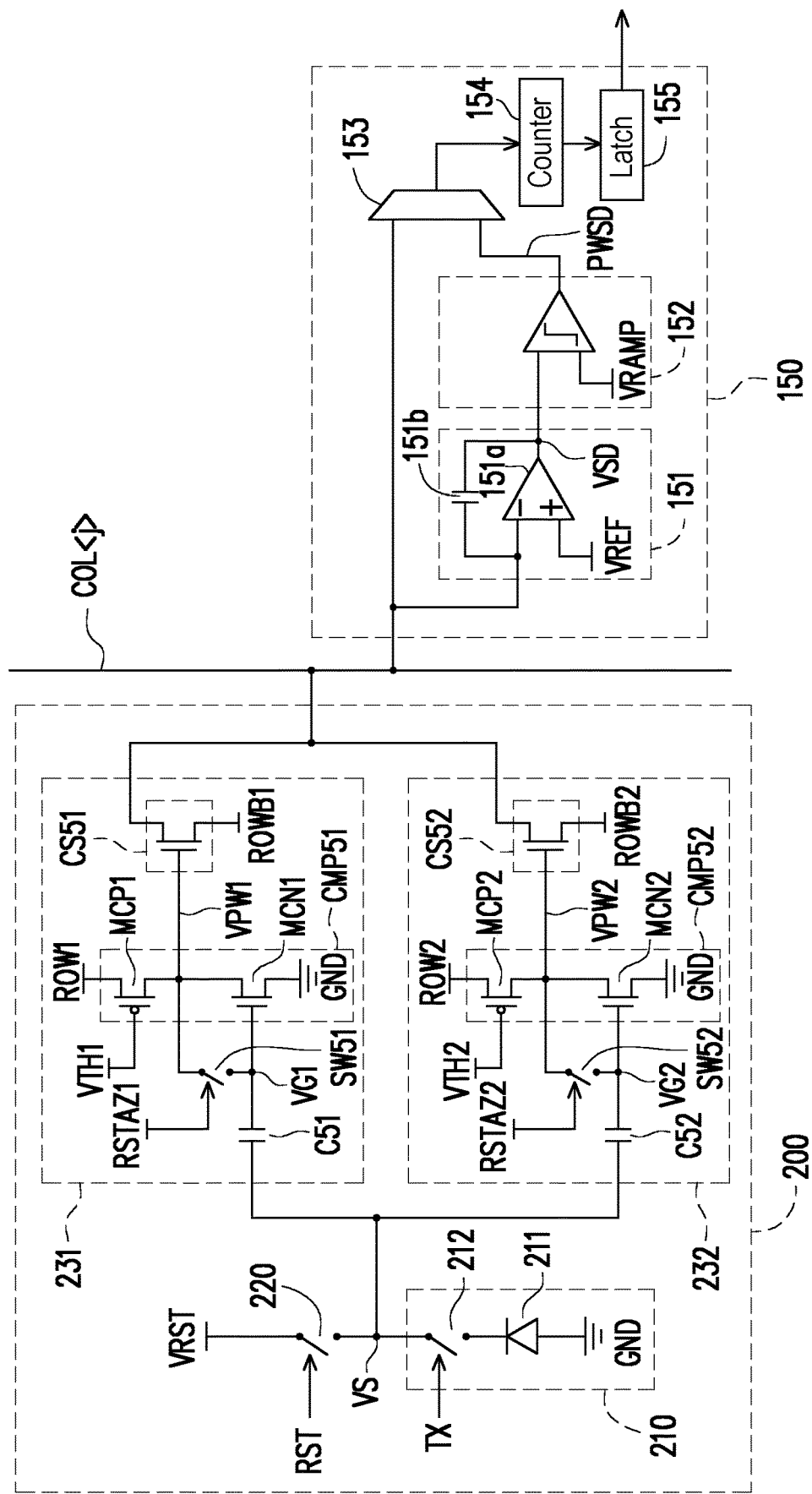
FIG. 12 is a circuit block diagram illustrating the comparator shown in FIG. 5 and the readout circuit shown in FIG. 2 according to an embodiment of the disclosure.

FIG. 12 is a circuit block diagram illustrating the comparators CMP51 and CMP52 shown in FIG. 5 and the readout circuit 150 shown in FIG. 2 according to an embodiment of the disclosure. In the embodiment shown in FIG. 12, the comparator CMP51 includes a transistor MCP1 and a transistor MCN1. The control terminal (e.g. gate) of the transistor MCP1 is coupled to the second input terminal of the comparator CMP51 to receive the reference voltage VTH1. The first terminal (for example, the source) of the transistor MCP1 receives the enable voltage ROW1. During the reset period A and the exposure period B in the frame period, the enable voltage ROW1 is in the disabled state. In the corresponding sub-period Cn of the readout period C of the frame period, the enable voltage ROW1 can be in the enabled state selectively, so that the output comparator CMP51 outputs the comparison result. The second terminal (for example, the drain) of the transistor MCP1 is coupled to the output terminal of the comparator CMP51 to provide the output voltage VPW1. The control terminal (e.g., gate) of the transistor MCN1 is coupled to the first input terminal of the comparator CMP51 to receive the input voltage VG1. The first terminal (for example, the source) of the transistor MCN1 receives a reference voltage (for example, the ground voltage GND). The second terminal (for example, the drain) of the transistor MCN1 is coupled to the output terminal of the comparator CMP51 to provide the output voltage VPW1.

The comparator CMP52 includes a transistor MCP2 and a transistor MCN2. The control terminal (e.g., gate) of the transistor MCP2 is coupled to the second input terminal of the comparator CMP52 to receive the reference voltage VTH2. The first terminal (for example, the source) of the transistor MCP2 receives the enable voltage ROW2. During the reset period A and the exposure period B in the frame period, the enable voltage ROW2 is in the disabled state. In the corresponding sub-period Cn of the readout period C of the frame period, the enable voltage ROW2 can be in the enabled state selectively, so that the output comparator CMP52 outputs the comparison result. The second terminal (for example, the drain) of the transistor MCP2 is coupled to the output terminal of the comparator CMP52 to provide the output voltage VPW2. The control terminal (e.g., the gate) of the transistor MCN2 is coupled to the first input terminal of the comparator CMP52 to receive the input voltage VG2. The first terminal (for example, the source) of the transistor MCN2 receives a reference voltage (for example, the ground voltage GND). The second terminal (for example, the drain) of the transistor MCN2 is coupled to the output terminal of the comparator CMP52 to provide the output voltage VPW2.

In the embodiment shown in FIG. 12, the readout circuit 150 includes an integrator 151, a comparator 152, a multiplexer 153, a counter 154, and a latch 155. The input terminal of the integrator 151 is coupled to the corresponding readout line COL<j>. This embodiment provides no limitation to the implementation of the integrator 151. For example, the integrator 151 may include an operational amplifier 151a and a capacitor 151b. The first input terminal (for example, the inverting input terminal) of the operational amplifier 151a is coupled to the input terminal of the integrator 151, that is, coupled to the corresponding readout line COL<j>. The second input terminal (for example, a non-inverting input terminal) of the operational amplifier 151a receives the reference voltage VREF. The level of the reference voltage VREF can be determined depending on actual design. The output terminal of the operational amplifier 151a is coupled to the output terminal of the integrator 151 to provide the integration result VSD. The first terminal and the second terminal of the capacitor 151b are respectively coupled to the first input terminal of the operational amplifier 151a and the output terminal of the operational amplifier 151a.

The first input terminal of the multiplexer 153 is coupled to the corresponding readout line COL<j>. The first input terminal of the comparator 152 is coupled to the output terminal of the integrator 151 to receive the integration result VSD. The second input terminal of the comparator 152 receives the ramp voltage VRAMP. The output terminal of the comparator 152 is coupled to the second input terminal of the multiplexer 153 to provide the comparison result PWSD. The input terminal of the counter 154 is coupled to the output terminal of the multiplexer 153. The output terminal of the counter 154 is coupled to the input terminal of the latch 155.

In the case where the image sensor chip 100 is selectively operated in a saliency detection mode, the multiplexer 153 can selectively couple the output terminal of the comparator 152 to the input terminal of the counter 154. Under the circumstances, the pixel unit 200, the integrator 151, the comparator 152, and the counter 154 shown in FIG. 12 can be deduced from the related descriptions of FIG. 8 and FIG. 11, so no further description is incorporated herein.

In the case that the image sensor chip 100 is selectively operated in the frame difference mode, the multiplexer 153 can selectively couple the corresponding readout line COL<j> to the input terminal of the counter 154. Under the circumstances, the pixel unit 200, the integrator 151, the comparator 152, and the counter 154 shown in FIG. 12 can be deduced from the related descriptions of FIG. 8 and FIG. 9, or from the related descriptions of FIG. 8, FIG. 10A, FIG. 10B, and FIG. 10C, so no further description is incorporated herein.

In the case where the image sensor chip 100 is selectively operated in the image capture mode, the multiplexer 153 can selectively couple the corresponding readout line COL<j> to the input terminal of the counter 154. Under the circumstances, the pixel unit 200, the integrator 151, the comparator 152, and the counter 154 shown in FIG. 12 can be deduced from the related descriptions of FIG. 6 and FIG. 7, so no further description is incorporated herein.

In summary, the image sensor chip 100 described in the foregoing embodiments can perform continuous frame difference computation. The image sensor chip 100 can store previous frames (sensing results during the first frame period). After the first frame period, the image sensor chip 100 can generate the difference between the previous frame and the current frame (the sensing result in the second frame period), and the image sensor chip 100 can store the current frame to facilitate the continuous frame difference computation to be performed again during the next frame period. Therefore, the next-level circuit (not shown, such as a processor) of the image sensor chip 100 can omit the continuous frame difference computation to reduce the computation load of the processor, thereby increasing the frame rate as much as possible. Furthermore, due to the omission of continuous frame difference computation, the processor can omit the frame buffer.

Although the disclosure has been disclosed in the above embodiments, it is not intended to limit the disclosure, and those skilled in the art can make some modifications and refinements without departing from the spirit and scope of the disclosure. Therefore, the scope of the disclosure is subject to the definition of the scope of the appended claims.

What is claimed is:

1. An image sensor chip, comprising:
a pixel array comprising a plurality of pixel units, wherein each of the plurality of pixel units comprises:
a light sensing circuit;
a first reset switch, coupled to a first terminal of the light sensing circuit, adapted to reset the light sensing circuit during a reset period; and
an output circuit, coupled to the first terminal of the light sensing circuit, configured to output difference information corresponding to a difference between a first sensing result of the light sensing circuit in a first frame period and a second sensing result of the light sensing circuit in a second frame period after the first frame period to a corresponding one of a plurality of readout lines of the pixel array, wherein the output circuit comprises:
a first comparator having a first input terminal coupled to a first capacitor, wherein a second input terminal of the first comparator is suitable for receiving a first reference voltage,
wherein the first comparator is configured to compare an input voltage at the first input terminal of the first comparator with the first reference voltage,
wherein when the output circuit operates in a frame difference mode, the first reset switch resets the light sensing circuit during the reset period in the first frame period, and the output circuit records the first sensing result in the first frame period, the first reset switch resets the light sensing circuit during the reset period in the second frame period, and the output circuit generates the difference information corresponding to the difference between the first sensing result and the second sensing result during the second frame period, and the output circuit outputs the difference information to the corresponding readout line during a readout period in the second frame period,
wherein when the output circuit operates in an image capture mode, the first reset switch resets the light sensing circuit during the reset period in the first frame period, and the output circuit does not record the first sensing result in the first frame period, the output circuit outputs first sensing information corresponding to the first sensing result to the corresponding readout line during a readout period in the first frame period, the first reset switch resets the light sensing circuit in the reset period during the second frame period, and the output circuit outputs second sensing information corresponding to the second sensing result to the corresponding readout line in the readout period during the second frame period.

2. The image sensor chip according to claim 1, wherein the light sensing circuit comprises:
a light sensing element; and
a switch having a first terminal and a second terminal respectively coupled to the first terminal of the light sensing circuit and a first terminal of the light sensing element.

3. The image sensor chip according to claim 2, wherein the light sensing element comprises a photodiode.

4. The image sensor chip according to claim 1, wherein the output circuit comprises:
a first circuit having an input terminal coupled to the first terminal of the light sensing circuit, wherein an output terminal of the first circuit is coupled to the corresponding readout line; and
a second circuit having an input terminal coupled to the first terminal of the light sensing circuit, wherein an output terminal of the second circuit is coupled to the corresponding readout line;
wherein when the output circuit operates in the frame difference mode, the first circuit records the first sensing result during the first frame period, the second circuit records the second sensing result during the second frame period, the first circuit generates first difference information corresponding to a difference between the first sensing result and the second sensing result during the second frame period, the first circuit outputs the first difference information to the corresponding readout line in the readout period during the second frame period, the first reset switch resets the light sensing circuit during the reset period in a third frame period after the second frame period, the first circuit records a third sensing result of the light sensing circuit during the third frame period in the third frame period, the second circuit generates second difference information corresponding to a difference between the second sensing result and the third sensing result during the third frame period, and the second circuit outputs the second difference information to the corresponding readout line during a readout period in the third frame period.

5. The image sensor chip according to claim 4, wherein when the output circuit operates in the image capture mode, one of the first circuit and the second circuit is disabled, and the other of the first circuit and the second circuit outputs the first sensing information corresponding to the first sensing result and second sensing information corresponding to the second sensing result to the corresponding readout line in the readout period during the first frame period and the readout period during the second frame period respectively.

6. The image sensor chip according to claim 1, wherein the output circuit comprises:
the first capacitor having a first terminal coupled to the first terminal of the light sensing circuit, wherein a second terminal of the first capacitor is coupled to the first input terminal of the first comparator;
a second reset switch having a first terminal and a second terminal respectively coupled to the first input terminal of the first comparator and an output terminal of the first comparator; and
a first current source having a control terminal coupled to the output terminal of the first comparator, wherein a current terminal of the first current source is coupled to the corresponding readout line.

7. The image sensor chip according to claim 6, wherein, when the output circuit operates in the image capture mode, the first reset switch and the second reset switch are turned on and the first comparator is in a disabled state during the reset period in the first frame period, the first reset switch and the second reset switch are turned off and the first comparator is in the disabled state during an exposure period of the first frame period, and the first reset switch and the second reset switch are turned off and the first comparator is in an enabled state in a corresponding sub-period of the readout period during the first frame period.

8. The image sensor chip according to claim 6, wherein when the output circuit operates in the image capture mode, the first reference voltage is a ramp voltage.

9. The image sensor chip according to claim 6, wherein the first comparator comprises:
a first transistor having a control terminal coupled to the second input terminal of the first comparator to receive the first reference voltage, wherein a first terminal of the first transistor receives an enable voltage, a second terminal of the first transistor is coupled to the output terminal of the first comparator, the enable voltage is in a disabled state during the reset period and an exposure period in the first frame period, and the enable voltage in a corresponding sub-period of the readout period during the first frame period is an enabled state; and
a second transistor having a control terminal coupled to the first input terminal of the first comparator, wherein a first terminal of the second transistor receives a second reference voltage, and a second terminal of the second transistor is coupled to the output terminal of the first comparator.

10. The image sensor chip according to claim 6, wherein the output circuit comprises:
a second capacitor having a first terminal coupled to the first terminal of the light sensing circuit;
a second comparator having a first input terminal coupled to a second terminal of the second capacitor, wherein a second input terminal of the second comparator is suitable for receiving a second reference voltage;
a third reset switch having a first terminal and a second terminal respectively coupled to the first input terminal of the second comparator and an output terminal of the second comparator; and
a second current source having a control terminal coupled to the output terminal of the second comparator, wherein a current terminal of the second current source is coupled to the corresponding readout line.

11. The image sensor chip according to claim 10, wherein when the output circuit operates in the frame difference mode:
in the reset period of the first frame period, the first reset switch and the second reset switch are turned on, the third reset switch is turned off, and the first comparator and the second comparator are in a disabled state;
in an exposure period of the first frame period and the readout period of the first frame period, the first reset switch and the third reset switch are turned off, the second reset switch is turned on, and the first comparator and the second comparator are in the disabled state;
in a corresponding sub-period of the readout period during the first frame period, the first comparator is in the disabled state, and the second comparator is in an enabled state;
in the reset period of the second frame period, the first reset switch and the third reset switch are turned on, the second reset switch is turned off, and the first comparator and the second comparator are in the disabled state;
in an exposure period of the second frame period and the readout period of the second frame period, the first reset switch and the second reset switch are turned off, the third reset switch is turned on, and the first comparator and the second comparator are in the disabled state; and
in a corresponding sub-period of the readout period during the second frame period, the first comparator is in the enabled state, and the second comparator is in the disabled state.

12. The image sensor chip according to claim 1, further comprising:
a readout circuit coupled to the plurality of readout lines of the pixel array, wherein
when the output circuit operates in the image capture mode, the output circuit compares the first sensing result with the first reference voltage during the readout period of the first frame period to generate first sensing information corresponding to the first sensing result and the output circuit outputs the first sensing information to the corresponding readout line, and the output circuit compares the second sensing result with the first reference voltage in the readout period during the second frame period to generate second sensing information corresponding to the second sensing result and the output circuit outputs the second sensing information to the corresponding readout line; and
when the output circuit operates in the frame difference mode, the output circuit compares the difference between the first sensing result and the second sensing result with the first reference voltage to output the difference information to the corresponding readout line.

13. The image sensor chip according to claim 12, wherein when the output circuit operates in the image capture mode, the first reference voltage is a ramp voltage, the readout circuit counts a first time length of the first sensing information to obtain a first counting code corresponding to the first sensing result, and the readout circuit counts a second time length of the second sensing information to obtain a second counting code corresponding to the second sensing result.

14. The image sensor chip according to claim 12, wherein when the output circuit operates in the frame difference mode, the first reference voltage is a ramp voltage, and the readout circuit counts a time length of the difference information to obtain a counting code corresponding to the difference information.

15. The image sensor chip according to claim 12, wherein when the output circuit operates in the frame difference mode, the first reference voltage comprises a first voltage level and a second voltage level, the output circuit compares the difference between the first sensing result and the second sensing result with the first voltage level to output first difference information of the difference information to the corresponding readout line, the output circuit compares the difference between the first sensing result and the second sensing result with the second voltage level to output second difference information of the difference information to the corresponding readout line, and the readout circuit uses the first difference information and the second difference information as a frame difference code corresponding to the difference information.

16. The image sensor chip according to claim 12, wherein the corresponding readout line connects a plurality of target pixel units of the plurality of pixel units,
when the output circuit operates in the frame difference mode, the first reference voltage comprises a first voltage level, the output circuit of each of the plurality of target pixel units compares the difference between the first sensing result with the second sensing result with the first voltage level to output the difference information to the corresponding readout line, the readout circuit integrates the difference information of the plurality of target pixel units to generate an integration result, the readout circuit compares the integration result with a ramp voltage to generate a comparison result, and the readout circuit counts a time length of the comparison result to obtain a counting code corresponding to the integration result.

17. The image sensor chip according to claim 12, wherein the readout circuit comprises:
a multiplexer having a first input terminal coupled to the corresponding readout line;
an integrator having an input terminal coupled to the corresponding readout line;
a comparator having a first input terminal coupled to an output terminal of the integrator, wherein a second input terminal of the comparator receives a ramp voltage, an output terminal of the comparator is coupled to a second input terminal of the multiplexer; and
a counter having an input terminal coupled to an output terminal of the multiplexer.

18. The image sensor chip according to claim 17, wherein the integrator comprises:
an operational amplifier having a first input terminal coupled to the input terminal of the integrator, wherein a second input terminal of the operational amplifier receives a second reference voltage, and an output terminal of the operational amplifier is coupled to the output terminal of the integrator; and
a capacitor having a first terminal and a second terminal respectively coupled to the first input terminal of the operational amplifier and the output terminal of the operational amplifier.

19. A sensing method for an image sensor chip, the image sensor chip comprising a pixel array containing a plurality of pixel units, wherein each of the plurality of pixel units comprises a light sensing circuit, a first reset switch, and an output circuit, the sensing method comprising:
resetting the light sensing circuit by the first reset switch during a reset period in a first frame period, wherein the first reset switch is coupled to a first terminal of the light sensing circuit;
generating a first sensing result by the light sensing circuit in the first frame period;
resetting the light sensing circuit by the first reset switch in a reset period in a second frame period after the first frame period;
generating a second sensing result by the light sensing circuit in the second frame period;
outputting, by the output circuit, difference information corresponding to a difference between the first sensing result and the second sensing result to a corresponding one of a plurality of readout lines of the pixel array, wherein the output circuit comprises:
a first comparator having a first input terminal coupled to a first capacitor, wherein a second input terminal of the first comparator is suitable for receiving a first reference voltage,
wherein the first comparator is configured to compare an input voltage at the first input terminal of the first comparator with the first reference voltage;
when the output circuit operates in a frame difference mode, the output circuit records the first sensing result in the first frame period, the output circuit generates the difference information corresponding to the difference between the first sensing result and the second sensing result during the second frame period, and the output circuit outputs the difference information to the corresponding readout line during a readout period in the second frame period; and
when the output circuit operates in an image capture mode, the output circuit does not record the first sensing result in the first frame period, the output circuit outputs first sensing information corresponding to the first sensing result to the corresponding readout line during a readout period in the first frame period, and the output circuit outputs second sensing information corresponding to the second sensing result to the corresponding readout line in the readout period during the second frame period.

20. The sensing method according to claim 19, wherein the output circuit comprises a first circuit and a second circuit, the sensing method further comprising:
when the output circuit operates in the frame difference mode, the first circuit records the first sensing result during the first frame period, the second circuit records the second sensing result during the second frame period, the first circuit generates first difference information corresponding to a difference between the first sensing result and the second sensing result during the second frame period, the first circuit outputs the first difference information to the corresponding readout line in the readout period during the second frame period, the first circuit records a third sensing result of the light sensing circuit during a third frame period in the third frame period after the second frame period, the second circuit generates second difference information corresponding to a difference between the second sensing result and the third sensing result during the third frame period, and the second circuit outputs the second difference information to the corresponding readout line during a readout period in the third frame period,
wherein an input terminal of the first circuit and an input terminal of the second circuit are coupled to the first terminal of the light sensing circuit, and an output terminal of the first circuit and an output terminal of the second circuit are coupled to the corresponding readout line.

21. The sensing method according to claim 20, further comprising:
when the output circuit operates in the image capture mode, one of the first circuit and the second circuit is disabled, and the other of the first circuit and the second circuit outputs first sensing information corresponding to the first sensing result and second sensing information corresponding to the second sensing result to the corresponding readout line in the readout period during the first frame period and the readout period during the second frame period respectively.

22. The sensing method according to claim 19, wherein the image sensor chip further comprises a readout circuit coupled to the plurality of readout lines of the pixel array, and the sensing method further comprises:

when the output circuit operates in the image capture mode, during the readout period of the first frame period, the output circuit compares the first sensing result with the first reference voltage to generate first sensing information corresponding to the first sensing result, and the output circuit outputs the first sensing information to the corresponding readout line;

when the output circuit operates in the image capture mode, during the readout period of the second frame period, the output circuit compares the second sensing result with the first reference voltage to generate second sensing information corresponding to the second sensing result, and the output circuit outputs the second sensing information to the corresponding readout line; and when the output circuit operates in the frame difference mode, the output circuit compares the difference between the first sensing result and the second sensing result with the first reference voltage to output the difference information to the corresponding readout line.

23. The sensing method according to claim 22, further comprising:

when the output circuit operates in the image capture mode, the readout circuit counts a first time length of the first sensing information to obtain a first counting code corresponding to the first sensing result, and the readout circuit counts a second time length of the second sensing information to obtain a second counting code corresponding to the second sensing result, wherein the first reference voltage is a ramp voltage when the output circuit operates in the image capture mode.

24. The sensing method according to claim 22, further comprising:

when the output circuit operates in the frame difference mode, the readout circuit counts a time length of the difference information to obtain a counting code corresponding to the difference information, wherein the first reference voltage is a ramp voltage when the output circuit operates in the frame difference mode.

25. The sensing method according to claim 22, wherein when the output circuit operates in the frame difference mode, the first reference voltage comprises a first voltage level and a second voltage level, and the sensing method further comprising:

when the output circuit operates in the frame difference mode, the output circuit compares the difference between the first sensing result and the second sensing result with the first voltage level to output first difference information of the difference information to the corresponding readout line;

when the output circuit operates in the frame difference mode, the output circuit compares the difference between the first sensing result and the second sensing result with the second voltage level to output second difference information of the difference information to the corresponding readout line; and when the output circuit operates in the frame difference mode, the readout circuit uses the first difference information and the second difference information as a frame difference code corresponding to the difference information.

26. The sensing method according to claim 22, wherein the corresponding readout line connects a plurality of target pixel units of the plurality of pixel units, when the output circuit operates in the frame difference mode, the first reference voltage comprises a first voltage level, and the sensing method further comprising:

when the output circuit operates in the frame difference mode, the output circuit of each of the plurality of target pixel units compares the difference between the first sensing result and the second sensing result with the first voltage level to output the difference information to the corresponding readout line;

when the output circuit operates in the frame difference mode, the readout circuit integrates the difference information of the plurality of target pixel units to generate an integration result;

when the output circuit operates in the frame difference mode, the readout circuit compares the integration result with a ramp voltage to generate a comparison result, and when the output circuit operates in the frame difference mode, the readout circuit counts a time length of the comparison result to obtain a counting code corresponding to the integration result.

* * * * *